United States Patent
Craven et al.

[11] Patent Number: 6,023,233
[45] Date of Patent: Feb. 8, 2000

[54] DATA RATE CONTROL FOR VARIABLE RATE COMPRESSION SYSTEMS

[76] Inventors: Peter G. Craven, 5, Trinity Walk, Tewkesbury, Gloucestershire, United Kingdom, GL20 5NP; Malcolm J. Law, 14, Stonecroft Close, Hangleton, Hove, East Sussex, United Kingdom, BN3 8BP

[21] Appl. No.: 09/044,986

[22] Filed: Mar. 20, 1998

[51] Int. Cl.[7] .................................................. H03M 7/00
[52] U.S. Cl. ........................................................... 341/51
[58] Field of Search ................................. 341/51, 55, 50; 375/240; 370/395

[56] References Cited

U.S. PATENT DOCUMENTS

| | | | |
|---|---|---|---|
| 3,621,389 | 11/1971 | Murray | 324/76.24 |
| 5,365,552 | 11/1994 | Astle . | |
| 5,398,072 | 3/1995 | Auld . | |
| 5,455,841 | 10/1995 | Hazu | 375/240 |

FOREIGN PATENT DOCUMENTS

| | | |
|---|---|---|
| 0 460 751 | 12/1991 | European Pat. Off. . |
| 0 626 770 | 11/1994 | European Pat. Off. . |
| 0 708 567 | 4/1996 | European Pat. Off. . |
| 0 723 345 | 7/1996 | European Pat. Off. . |
| 2 307 151 | 5/1997 | United Kingdom . |
| 2 309 611 | 7/1997 | United Kingdom . |
| WO96/20575 | 7/1996 | WIPO . |

OTHER PUBLICATIONS

Lu et al, "Mechanisms of MPEG Stream Synchronization", Jan. 1994, Computer Communications Review, vol. 24, No. 1, pp. 57–67.
Patent Abstracts of Japan, vol. 095, No. 004, May 1995, M. Fuerutoman.

*Primary Examiner*—Brian Young
*Attorney, Agent, or Firm*—Nixon & Vanderhye P.C.

[57] ABSTRACT

An encoder for a data compression system comprises a core encoder and a FIFO buffer. The FIFO buffer is able to absorb short bursts of high data rate and deliver the data to a transmission medium at a rate that it can handle. A corresponding decoder includes a FIFO buffer which receives data at a rate not exceeding the maximum that the transmission medium can deliver, but delivers data to a core encoder at a rate which can, for short periods, greatly exceed the rate from a transmission medium. With consumer media such as CD and DVD, the decoder cost is paramount so it is important to minimize the size of buffer memory required. Another consideration is the delay caused by the buffering since it is important to the latency between the user selecting a track or index point and hearing the decoded audio.

54 Claims, 3 Drawing Sheets

(a) Lossless encoder (b) Lossless decoder

DATA RATE CONTROL FOR VARIABLE RATE COMPRESSION SYSTEMS

FIELD OF THE INVENTION

The invention addresses the transmission of encoded data having an inherently variable data rate, though a transmission medium that imposes a limitation on the peak data rate.

BACKGROUND TO THE INVENTION

In data compression schemes for data that represent real-time signals, data is compressed by an encoder, fed to a transmission medium and decompressed by a decoder. By transmission medium we include media such as disc and tape that play out at a later time, as well as near-instantaneous transmission links such as radio.

Such compression schemes fall into two broad categories: lossy and lossless, as discussed in reference [1] for audio signals. Both types of compression attempt to save data by exploiting the redundancy inherent in linear pulse code modulation (PCM); lossy compression in addition has the option to discard data, and thus not to reproduce the original exactly.

Well-known lossy compression systems for audio data include MPEG, Dolby Digital, PASC and ATRAC. All of these encode a linear PCM stream to a compressed stream that has a lower and constant data rate. Constancy of the encoded data rate is an important consideration for real-time transmission over channels such as radio links, or for linear media such as tape, where the read-out rate is the limiting factor. It is less important for storage on hard discs where the read-out rate is less of a bottleneck and the reason for the compression is simply to reduce the total amount of data.

A lossy compression scheme achieves a desired constant data rate by discarding data until the target rate is achieved. Lossless compression does not have this option, and as the redundancy in the original stream is variable (being, in general, greater during quiet passages than during loud passages) the data rate emerging from the lossless encoder is also variable. A variable-rate bitstream can be converted to a constant rate by stuffing, or padding, in which case the resulting constant data rate is equal to the peak data rate from the lossless encoder.

The concept of peak data rate requires some clarification. Many compression schemes make use of Huffman coding whereby a sample is encoded to a number of bits dependent on its magnitude. The encoding is optimised to minimise the average data rate resulting from an assumed probability distribution of the incoming samples, which typically models large samples as occurring with low probability. When a large sample does occur, the resulting number of bits will be above average and may well be greater than the number of bits used for the original PCM encoding. Hence stuffing the encoded stream to give a constant data rate equal to the instantaneous peak data rate is not sensible.

A more sensible measure of peak data rate is given by averaging over a time-window, and the resulting peak rate is then dependent of the length of the window. For example, the SQAM test CD ["Sound Quality Assessment Material CD" EPU 1988 4222042] contains 16-bit audio sampled at 44.1 kHz. Using a particular encoder, the peak data rate over a time-window of 160 samples is 14.68 bits/sample, whereas over a time window whose length is equal to the whole disc the peak data rate is only 4.68 bits/sample.

Many lossless encoders break the signal into frames of fixed-length, typically about 1000 samples, for analysis. The frame then provides the natural time-window over which to measure the peak data rate. The encoded frames will contain variable amounts of data and each frame can be serialised and transmitted while the next frame is being encoded. The peak data rate required of the transmission medium then corresponds to the encoded frame with the largest amount of data.

In this case the peak data rate can be reduced by using longer frames. However, the use of longer frames incurs the disadvantages of more buffer memory being required in the decoder, and of an increased latency between the application of the data-stream to the decoder and the emergence of the first decoded sample. The object of the present invention is to reduce these disadvantages.

SUMMARY OF THE INVENTION

According to the invention in a first aspect, the encoder for a data compression system comprises a core encoder and a first in first out (FIFO) buffer. The FIFO buffer is placed between the core encoder and the transmission medium. Similarly the decoder comprises a FIFO buffer and a core decoder. The decoder's FIFO buffer is placed between the transmission medium and the core decoder. The encoder's FIFO buffer is able to absorb short bursts of high data rate and deliver the data to the transmission medium at a rate that it can handle. Correspondingly the decoder's FIFO buffer receives data at a rate not exceeding the maximum that the transmission medium can deliver, but delivers data to the core decoder at a rate which can, for short periods, greatly exceed the rate from the transmission medium. With this scheme, the encoder's buffer will start to fill during passages of peak data rate and the decoder's buffer will start to empty. The decoder's buffer will be able to replenish itself when the core decoder is consuming data at a lower rate than the transmission medium supplies it, and the encoder's buffer will empty. If there is a passage of peak data rate immediately after the decoder is started, the decoder's FIFO buffer may not have a chance to fill sufficiently to fulfil the core decoder's demand for data. Therefore in a preferred embodiment, the decoder will allow its buffer to fill partially before the core decoder starts to decode data. However, it is desirable to start the core decoder as soon as the buffer is filled to the minimum amount necessary to prevent subsequent under-run in the buffer, otherwise there is unnecessary delay before the decoded signal is available, and also the capacity of the decoder's buffer could be exceeded.

Hence in a preferred embodiment, the encoder transmits information that enables the decoder to determine the optimal time to begin transferring data from the FIFO buffer to the core decoder.

A simple encoder may, at each time-step, transfer as much data as possible from its FIFO buffer to the transmission medium. This amount of data will be the lesser of (a) the amount in the FIFO buffer and (b) the amount that the transmission medium can carry at that time-step. By transferring as much data as possible, the encoder minimises the risk that its own buffer will overflow subsequently, or that the decoder's buffer will become empty. However, if the encoder is able to look ahead, it may be able to determine that these situations will not occur even if less than the maximum amount of data are transferred at the current time-step.

In a preferred embodiment, the encoder performs such a look-ahead and transmits a lesser quantity of data, giving the benefit of reduced decoding latency.

The above discussion has assumed that the core encoding process is fixed. However, in some applications the core encoder may be parameterisable in a manner that varies the encoded data rate. For example, the computational effort applied to the encoding may be varied, or the amount of data discarded by lossy encoders may be varied. Accordingly, the invention in a second aspect provides for a parameterisable core encoder to be followed by a FIFO buffer, where the parameters of the encoding are adjusted in response to the amount of data in the buffer. In the examples above, one would increase the computational effort applied and/or increase the amount of data discarded by a lossy encoder, in order to reduce the data rate from the core encoder as the buffer fills. This provides an effective means of balancing the conflicting requirements of minimising the total computational effort applied to the encoding, minimising the amount of data discarded, and constraining the peak transmitted data rate.

BRIEF DESCRIPTION OF THE DRAWINGS

Examples of the present invention will now be described in detail with reference to the accompanying drawings, in which.

DETAILED DESCRIPTION OF PREFERRED EMBODIMENTS

Principles of FIFO Buffering

Figure 1:
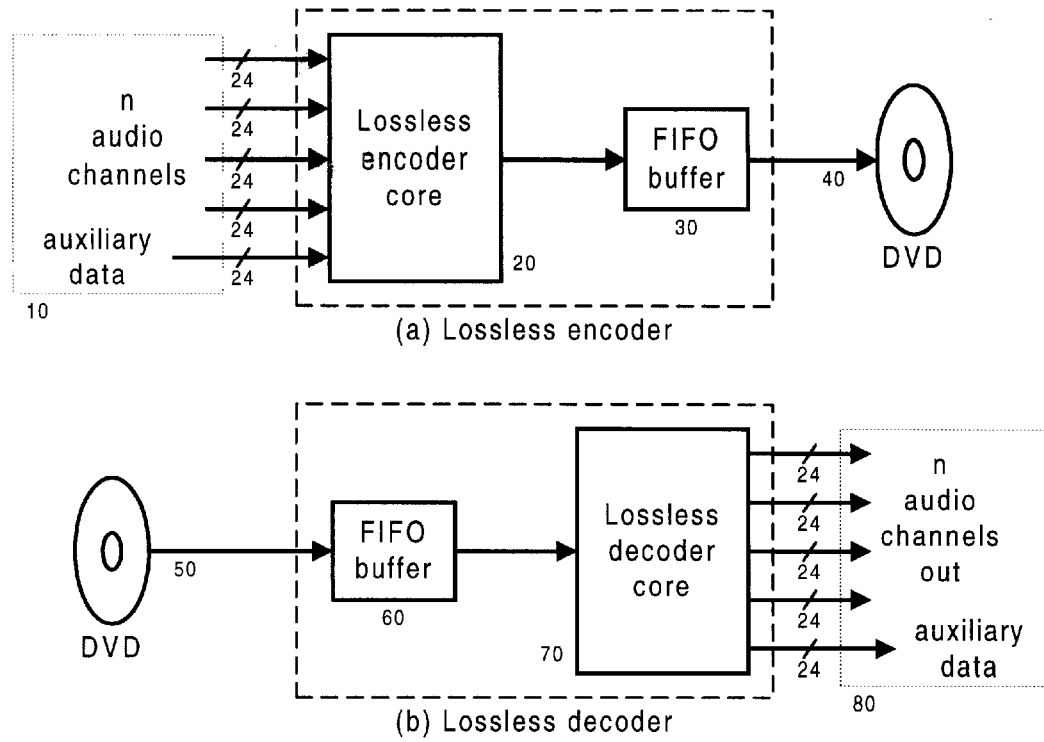
FIGS. 1A and 1B show an encoder and decoder according to the invention, specialised for recording and reproducing losslessly compressed data on DVD.

The invention will be described with reference to a particular proposed application: the lossless compression of audio signals for transmission on CD or DVD Video. In both cases the peak data rate is constrained:

the maximum is 1·4112 Mbits/s in the case of CD and 6·144 Mbits/s in the case of DVD. FIG. 1A shows a lossless encoder in which the input 10 (comprising, in this case, n channels of 24-bit PCM audio, plus some auxiliary data) is compressed by a lossless encoder core 20, into a stream which is fed through a FIFO buffer 30, to produce an output stream 40 which is fed to a DVD mastering system. In FIG. 1B, the corresponding decoder takes the stream 50 from the DVD, passes it through the FIFO buffer 60 and then through the core decoder 70 to produce the output 80 (consisting of audio in PCM format plus auxiliary data).

With consumer media such as CD and DVD, the decoder cost is paramount so it is important to minimise the size of buffer memory required. Another consideration is the delay caused by the buffering. The delay will not cause loss of lip-sync in a video context, as a mastering system can allow for it; however it will be a cause of latency between the user selecting a track or index point and hearing the decoded audio.

The decoder's buffer must be big enough to hold the total amount of data transmitted during the latency period. The latency times the maximum transmission rate provides an upper bound for the required memory, for example if the latency is 0.125 sec on a DVD stream of 6·144 Mbits/s, a buffer of 768 kBits (96 kbytes) will suffice.

For storage media such as disc and tape, playback will take place at a later time than recording: however for the purpose of explaining the buffering and latency this delay through the medium is irrelevant. Hence we shall work with the conceptual model of FIG. 2 whereby the received stream 50 is identified with the transmitted stream 40. Moreover, we shall assume, without loss of generality, that the delays through the core encoder 20 and core decoder 70 are both zero. The person skilled in the art will see how this model can be applied to real situations where there is storage delay, by shifting the time-reference of the decoding system.

Figure 2:
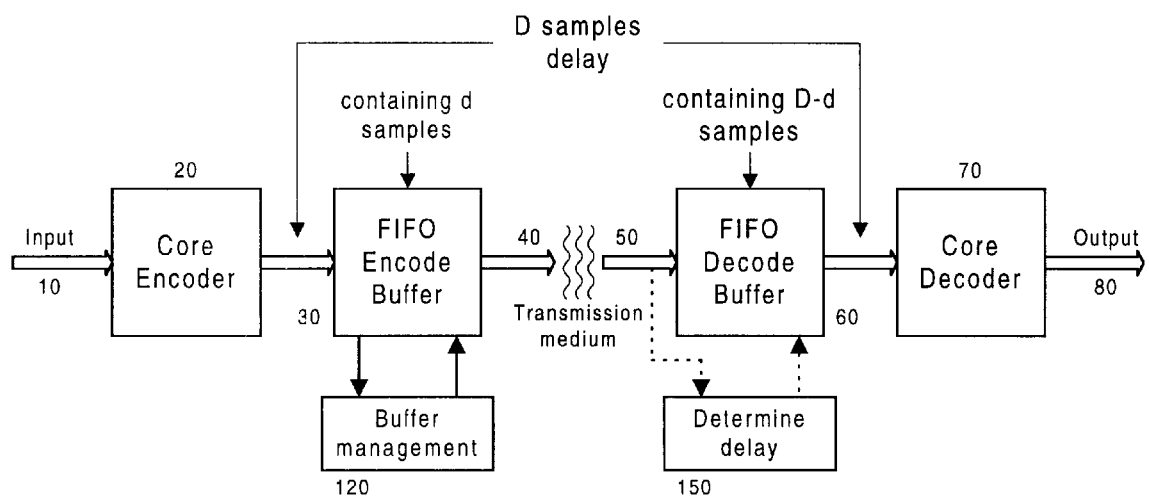
FIG. 2 shows a conceptual model of an encoding and decoding system according to the invention, in which transmission delays are ignored.

FIG. 2 shows an embodiment of the invention in which the encoder comprises an input 10, a core encoder 20, and a FIFO buffer 30. Control logic 120 controls the rate at which encoded data are transferred from the FIFO buffer 30 to the output 40. The decoder comprises an input 50, a FIFO buffer 60, a core decoder 70 and an output 80. In a preferred embodiment that will be discussed later, control logic 150 reads information from the input stream 50 in order to determine a delay.

Consider that, initially, both buffers in FIG. 2 are empty. The core encoder 20 starts to encode the input samples 10. The resulting encoded samples are passed through the encoder's buffer 30 and the transmission medium to the decoder's buffer 60, which begins to fill in consequence. After a delay of D samples, the core decoder 70 is started, and produces an output 80, which is representation of the input stream delayed by D samples.

Because of the assumed variable-rate nature of the compression process, the total amount of data stored in the two buffers, as measured in bits or bytes, will vary. However if we measure the contents of each of these buffers in terms of the delay it represents, the total represents the delay through the system, which must be constant and equal to the initial delay D, otherwise the reproduction will be distorted.

Thus, if the encode buffer holds data corresponding to a delay $d_e$ and the decode buffer holds data corresponding to delay $d_d$, $$d_e + d_d = D$$
$$d_e \geq 0$$
$$d_d \geq 0$$

the latter two relationships being required for causality.

As time goes on, the core encoder produces data and the core decoder consumes data. If these were the only active processes, $d_e$ would increase linearly and $d_d$ would decrease linearly. However the encoder also has the ability to transfer data through the transmission medium. When s seconds' worth of data is transferred, $d_e$ decreases by s, and $d_d$ increases by s.

It is the task of the buffer management algorithm 120 to determine how much data to transfer at each time-step, subject to the above constraints, and subject to the maximum data rate of the transmission channel not being exceeded.

Various algorithms for the management of the encode and decode FIFO buffers will be described with reference to the data in Table 1, which was obtained by applying a short section of one channel track 6 of the CD "Hello, I must be going" by Phil Collins (Virgin CDV2252) to a particular lossless encoder. For economy the data have been tabulated over time-slots (or blocks) of 160 samples (3-6 ms).

TABLE 1

| Time-slot | Bits generated by core encoder | Bits in encode buffer | Bits transmitted | Bits in decode buffer | Bits consumed by core decoder |
|---|---|---|---|---|---|
| 0 | 1888 | 288 | 1600 | 1600 | 0 |
| 1 | 1845 | 533 | 1600 | 1312 | 1888 |
| 2 | 1805 | 738 | 1600 | 1067 | 1845 |
| 3 | 1708 | 846 | 1600 | 862 | 1805 |
| 4 | 1684 | 930 | 1600 | 754 | 1708 |
| 5 | 1640 | 970 | 1600 | 670 | 1684 |
| 6 | 1603 | 973 | 1600 | 630 | 1640 |
| 7 | 1629 | 1002 | 1600 | 627 | 1603 |
| 8 | 1594 | 996 | 1600 | 598 | 1629 |
| 9 | 1567 | 963 | 1600 | 604 | 1594 |
| 10 | 1634 | 997 | 1600 | 637 | 1567 |
| 11 | 1577 | 974 | 1600 | 603 | 1634 |
| 12 | 1550 | 924 | 1600 | 626 | 1577 |
| 13 | 1543 | 867 | 1600 | 676 | 1550 |
| 14 | 1541 | 808 | 1600 | 733 | 1543 |
| 15 | 1522 | 730 | 1600 | 792 | 1541 |
| 16 | 1569 | 699 | 1600 | 870 | 1522 |
| 17 | 1527 | 626 | 1600 | 901 | 1569 |
| 18 | 1532 | 558 | 1600 | 974 | 1527 |
| 19 | 1555 | 513 | 1600 | 1042 | 1532 |
| 20 | 1535 | 448 | 1600 | 1087 | 1555 |
| 21 | 1497 | 345 | 1600 | 1152 | 1535 |
| 22 | 1490 | 235 | 1600 | 1255 | 1497 |
| 23 | 1454 | 89 | 1600 | 1365 | 1490 |
| 24 | 1461 | 0 | 1550 | 1461 | 1454 |
| 25 | 1443 | 0 | 1443 | 1443 | 1461 |
| 26 | 1454 | 0 | 1454 | 1454 | 1443 |
| 27 | 1441 | 0 | 1441 | 1441 | 1454 |
| 28 | 1453 | 0 | 1453 | 1453 | 1441 |
| 29 | 1450 | 0 | 1450 | 1450 | 1453 |
| 30 | 1546 | 0 | 1546 | 1546 | 1450 |
| 31 | 1492 | 0 | 1492 | 1492 | 1546 |
| 32 | 1447 | 0 | 1447 | 1447 | 1492 |
| 33 | 1476 | 0 | 1476 | 1476 | 1447 |
| 34 | 1455 | 0 | 1455 | 1455 | 1476 |
| 35 | 1459 | 0 | 1459 | 1459 | 1455 |
| 36 | 1405 | 0 | 1405 | 1405 | 1459 |
| 37 | 1427 | 0 | 1427 | 1427 | 1405 |
| 38 | 1552 | 0 | 1552 | 1552 | 1427 |
| 39 | 1899 | 299 | 1600 | 1600 | 1552 |
| 40 | 1844 | 543 | 1600 | 1301 | 1899 |
| 41 | 1780 | 723 | 1600 | 1057 | 1844 |
| 42 | 1776 | 899 | 1600 | 877 | 1780 |
| 43 | 1746 | 1045 | 1600 | 701 | 1776 |
| 44 | 1744 | 1189 | 1600 | 555 | 1746 |
| 45 | 1688 | 1277 | 1600 | 411 | 1744 |
| 46 | 1690 | 1367 | 1600 | 323 | 1688 |
| 47 | 1662 | 1429 | 1600 | 233 | 1690 |
| 48 | 1643 | 1472 | 1600 | 171 | 1662 |
| 49 | 1624 | 1496 | 1600 | 128 | 1643 |
| 50 | 0 | 0 | 1496 | 0 | 1624 |

The short excerpt (180 ms) occupies 50 blocks, numbered 0 to 49, and the second column in Table 1 shows the number of bits generated by the core encoder for each block. This varies between 1888 and 1405, with an average of 1590.96.

Delays and Decoding Latency

The two important timing parameters are the total delay through the encoder and decoder, and the decoding latency.

Aside from the transport delay in the storage or transmission medium, a practical system will suffer a total delay made up of several components:

FIFO buffering delay

Computational delay in the core encoder and decoder

Delays from the serialisation and re-blocking when data are converted between sample-based and block-based processes.

Possible further delays from lack of fine-structure information on the data rate.

As this invention is concerned with FIFO buffering, it is the contribution from the buffering that is alluded to when we speak of the total delay D. With care, the other delays can usually be made small in comparison; moreover we are not concerned with the transport delay, and we shall generally adopt the idealisation that the transport delay is zero.

(The delays from the serialisation and re-blocking of data are avoidable if the input, output, encoder, decoder, and transmission medium all operate on a sample-by-sample basis, or alternatively all operate on a block-by-block basis.)

The decoder latency is the time between the compressed stream being applied to the decoder, and the decoder delivering decoded samples. In real-time applications (such as radio links using lossless compression) the latency may be unimportant once the connexion has been established. Whereas on DVD, total delay is unimportant as the mastering system can compensate for it, but decoder latency may be important to the user, especially in interactive applications.

The decoder latency will be composed of several elements, including:

FIFO buffering delay in the decoder

Computational delay in the core decoder

Delays from serialisation and re-blocking

Possible further delays from lack of fine-structure information on the data rate.

Delays caused by the inability to decode from an arbitrary point.

The last of these refers to the fact that a decoder for compressed data must usually start from a defined point, known variously as a "block boundary", "frame boundary" or "re-start point". This will cause a variable latency, and so will the FIFO buffer, which causes a latency that depends on the amount of data in the buffer.

In a context such as DVD, it is desirable to minimise latency in all cases. In addition, latency implies the need for storage, and it is thus desirable to minimise the peak latency in order to minimise memory costs in mass-production.

Buffer Management—Simple Strategy

In Table 1 we assume a transmission channel that is able to transfer a maximum of 1600 bits in the time-slot corresponding to one block.

It is apparent that the first block of 1888 bits cannot be transmitted in this time-slot and thus cannot be decoded immediately. Hence, a delay D of at least one block period is needed. This is in fact sufficient (under the previously explained convention that transport delay is ignored and there are no delays associated with serialising data and re-blocking). The delay D=1 is evident in Table 1, column 6, where it will be seen that the core decoder starts one block period later than the core encoder.

The management strategy assumed in Table 1 is that the encoder transmits the maximum number of bits possible, subject to the maximum of 1600 and to the fact that the number of bits in the encode buffer must not become negative.

Thus, block 0 encodes to 1888 bits. Of these, 1600 are transmitted, leaving 288 in the encoder's buffer (column 3). As the core decoder consumes zero bits (column 6), 1600 bits remain in the decoder's buffer (column 5) at the end of this time step.

On the next time step, the encoder is able to transmit a further 1600 bits, hence there are 3200 bits available to the core decoder which consumes 1888, leaving 1312 in the decode buffer.

The process continues until we reach block 24, where the encoder is no longer able to transmit 1600 bits as the data rate from the core encoder has fallen below this rate and its buffer has become empty. Samples from the core encoder are then transmitted immediately they are produced, until the data rate from the core encoder once again exceeds 1600 bits per block, at block 39.

To formalise the above, we introduce the following symbols:

N=maximum no. of bits transmitted per time-slot
$T_i$=bits transmitted in time-slot i
$X_i$=bits produced by core encoder in time-slot i
$Y_i$=bits consumed by core decoder in time-slot i
$E_i$=bits in encode buffer at end of time-step i
$F_i$=bits in decode buffer at end of time-step i As D is the FIFO buffer delay between encoding and decoding, we have:

$$Y_{i+D}=X_i$$

for all i. The action of the encoder on the $i^{th}$ time-step can be expressed as:

$$E_i:=E_{i-1}+X_i$$

$$T_i:=\min(E_i, N)$$

$$E_i:=E_i-T_i$$

and the action of the decoder can be expressed as:

$$F_i:=F_{i-1}+T_i-Y_i$$

where ":=" denotes assignment.

Table 1, shows that, by providing a decode buffer equal to just one block's worth of data (1600 bits) and by delaying the decoding by one block, the core decoder has been kept supplied with the data it needs. Consider that the first eight blocks of the excerpt all require more than 1600 bits. It will be seen that the FIFO buffering is far more effective than simply using a larger block size. It would have been necessary to use blocks of length 4000 samples, that is twenty-five times as large as used here, in order to bring the average data rate over a block down to the 10 bits/sample that the transmission medium can handle.

Assuming that a decoder requires 1 block of buffering in addition to any FIFO buffer, the FIFO buffer is more than ten times as efficient in terms of memory use and decoder latency on this example.

The advantages of the FIFO buffer over a moving average model are displayed, for another piece of music, in Table 2. Here the data rate (in bits/sample) required of the transmission channel is tabulated against the allowable latency. For a latency of 116 ms (32 blocks of 160 samples), the channel's data rate needs to be 2 bits per sample higher if simple averaging is used than if FIFO buffering according to the invention is used. (Table 2 relates to the encoding of a different piece of music from Table 1.)

TABLE 2

| Delay ms | FIFO buffer | Moving average |
|---|---|---|
| 7.3 | 13.06 | 13.87 |
| 14.5 | 12.69 | 13.71 |
| 29 | 12.23 | 13.56 |
| 58 | 11.64 | 13.42 |
| 116 | 11.10 | 13.37 |
| 232 | 10.73 | 13.25 |

Buffer Management for Reduced Latency

The buffer management strategy discussed above transfers as much data as possible to the decoder's FIFO buffer at each time step. By keeping the decoder's FIFO buffer as full as possible it minimises the risk that the decode buffer will subsequently run out of data, but this is at the expense of a high latency in the decoder for nearly all the time.

TABLE 3

| Time-slot | Bits generated by core encoder | Bits in encode buffer | Bits transmitted | Bits in decode buffer | Bits consumed by core decoder |
|---|---|---|---|---|---|
| 0 | 1888 | 886 | 1002 | 1002 | 0 |
| 1 | 1845 | 1131 | 1600 | 714 | 1888 |
| 2 | 1805 | 1336 | 1600 | 469 | 1845 |
| 3 | 1708 | 1444 | 1600 | 264 | 1805 |
| 4 | 1684 | 1528 | 1600 | 156 | 1708 |
| 5 | 1640 | 1568 | 1600 | 72 | 1684 |
| 6 | 1603 | 1571 | 1600 | 32 | 1640 |
| 7 | 1629 | 1600 | 1600 | 29 | 1603 |
| 8 | 1594 | 1594 | 1600 | 0 | 1629 |
| 9 | 1567 | 1566 | 1595 | 1 | 1594 |
| 10 | 1634 | 1600 | 1600 | 34 | 1567 |
| 11 | 1577 | 1577 | 1600 | 0 | 1634 |
| 12 | 1550 | 1550 | 1577 | 0 | 1577 |
| 13 | 1543 | 1543 | 1550 | 0 | 1550 |
| 14 | 1541 | 1541 | 1543 | 0 | 1543 |
| 15 | 1522 | 1522 | 1541 | 0 | 1541 |
| 16 | 1569 | 1569 | 1522 | 0 | 1522 |
| 17 | 1527 | 1527 | 1569 | 0 | 1569 |
| 18 | 1532 | 1532 | 1527 | 0 | 1527 |
| 19 | 1555 | 1555 | 1532 | 0 | 1532 |
| 20 | 1535 | 1535 | 1555 | 0 | 1555 |
| 21 | 1497 | 1497 | 1535 | 0 | 1535 |
| 22 | 1490 | 1490 | 1497 | 0 | 1497 |
| 23 | 1454 | 1454 | 1490 | 0 | 1490 |
| 24 | 1461 | 1461 | 1454 | 0 | 1454 |
| 25 | 1443 | 1443 | 1461 | 0 | 1461 |
| 26 | 1454 | 1454 | 1443 | 0 | 1443 |
| 27 | 1441 | 1441 | 1454 | 0 | 1454 |
| 28 | 1453 | 1395 | 1499 | 58 | 1441 |
| 29 | 1450 | 1245 | 1600 | 205 | 1453 |
| 30 | 1546 | 1191 | 1600 | 355 | 1450 |
| 31 | 1492 | 1083 | 1600 | 409 | 1546 |
| 32 | 1447 | 930 | 1600 | 517 | 1492 |
| 33 | 1476 | 806 | 1600 | 670 | 1447 |
| 34 | 1455 | 661 | 1600 | 794 | 1476 |
| 35 | 1459 | 520 | 1600 | 939 | 1455 |
| 36 | 1405 | 325 | 1600 | 1080 | 1459 |
| 37 | 1427 | 152 | 1600 | 1275 | 1405 |
| 38 | 1552 | 104 | 1600 | 1448 | 1427 |
| 39 | 1899 | 403 | 1600 | 1496 | 1552 |
| 40 | 1844 | 647 | 1600 | 1197 | 1899 |
| 41 | 1780 | 827 | 1600 | 953 | 1844 |
| 42 | 1776 | 1003 | 1600 | 773 | 1780 |
| 43 | 1746 | 1149 | 1600 | 597 | 1776 |
| 44 | 1744 | 1293 | 1600 | 451 | 1746 |
| 45 | 1688 | 1381 | 1600 | 307 | 1744 |
| 46 | 1690 | 1471 | 1600 | 219 | 1688 |
| 47 | 1662 | 1533 | 1600 | 129 | 1690 |
| 48 | 1643 | 1576 | 1600 | 67 | 1662 |
| 49 | 1624 | 1600 | 1600 | 24 | 1643 |
| 50 | 0 | 0 | 1600 | 0 | 1624 |

Table 3 illustrates the converse strategy, whereby the amount of data in the decoder's buffer is minimised. In other respects it is akin to Table 1.

In Table 3, after the initial period of high data rate (blocks 0 through 10), the data rate from the core encoder falls below the critical value of 1600 bits per block, and then rises above that figure for blocks 39 through 49. Hence the decoder buffer needs a reserve of bits just before block 39. The difference between Table 1 and Table 3 relates to the time when this reserve is transmitted. In table 1, it is transmitted as soon as possible, and the decode buffer starts to fill at time-slot 12, immediately after the initial peak passage has been decoded. Whereas in Table 3 it is transmitted as late as possible, indeed the decode buffer remains empty from block 11 to block 27, filling from block 28 onwards in anticipation of the final peak passage.

The "filling . . . in anticipation" implies look-ahead in the encoder, and in Table 3 this was achieved by a backward scan through the tabulated data. Thus, as the core decoder requires 1624 bits in time-slot 50, it follows that, at least (1624−1600)=24 bits must be in the decoder's buffer at the end of the previous time-slot. Similarly, to satisfy the core decoders demand for 1643 bits on time-slot 49, the buffer must contain at least 24 +(1643−1600)=67 bits at the end of time-slot 48.

Working backwards in this way, we can determine the minimum number of bits required in the decode buffer, to ensure that it does not under-run subsequently. We thus arrive at time-slot 28, which must finish with 58 bits in the buffer. As the core decoder consumes only 1441 bits in this time-slot, it is adequate that (58+1441)=1499 bits be transmitted, with no requirement for any data to remain in the buffer at the end of the previous time-slot (slot 27).

We can formalise the preceding discussion into the following backward-pass algorithm:

If imnax is the maximum value of i for which the encoder's output is non-zero, and we assume that:

$X_i$=0 except when $0 \leq i \leq$ imax
$Y_i$=0 except when $D \leq i \leq$ imax+D,
then the reduced latency algorithm can be expressed as:

```
F_{imax+D} := 0
FOR i FROM (imax + D) BY −1 TO 0
DO
    T_i     := min(F_i + Y_i, N)
    F_{i−1} := (F_i + Y_i) − T_i
OD
```

Finite Look-ahead Algorithm

It may be inconvenient to have a backward pass through the entire data as required by the above reduced latency algorithm: indeed it is quite impossible for a real-time encoder to do this. Fortunately, most of the benefits can be obtained using a finite look-ahead.

The most intuitive description is for the case where the encoder models a decoder having a FIFO buffer of finite size, and attempts to avoid both under-run and over-run of the decoder's buffer.

The principle is to transmit an assumed amount $T_i$ of data on time-step i, then to model the filling and emptying of the decode buffer over a look-ahead period la, on the assumption that the maximum possible amount of data (N bits) are transferred on each subsequent time step. We establish the minimum value of $T_i$ required to prevent under-run of the decode buffer during the look-ahead period. If this minimum is greater than N, then the algorithm has failed, see below. Otherwise, we consider whether to transmit more than this minimum. To do so may reduce the risk of decode buffer under-run after the look-ahead period, but there is no point in increasing $T_i$ if the decode buffer is able to fill within the look-ahead period. If it is not able so to do, we increase Ti until it reaches the maximum $T_i$=N.

If, even with $T_i$=N, the decode buffer under-runs within the look-ahead period, then transmission is not possible with the given values of N, D and $F_{size}$ (the assumed size for the decoder's FIFO buffer). In other words, this algorithm will not fail in cases where the simple management strategy or the backward-pass algorithm would have succeeded. Relative to the backward-pass algorithm, the restriction to a finite look-ahead causes an increased latency in some places, but does not increase the risk of incorrect transmission.

In the pseudo-code below, the possibility of encode buffer under-run is also taken into account: this was ignored in the description above. Here:

$F_{size}$ is the size of the decoder's buffer
la is the length of the look-ahead period
$F_{ij}$ is the prediction made at time-slot i of the contents of the decode buffer at time-slot j, assuming that $T_i$=0; $T_k$=N for i<k≤j, given by $$F_{ij} = F_{i-1} + (j-i) \times N - \Sigma[Y_k, k=i \ldots j]$$

We also have auxiliary variables:

$F_{min}$ and $F_{max}$ are the predicted minimum and maximum contents of the decode buffer
$T_{max}$ is the maximum amount of data that can be transmitted in the current time-step without violating current constraints and the algorithm proceeds as follows:

```
E_{−1}   := F_{−1}   := 0
FOR i FROM 0 TO max_i
DO
    F_min  := min(F_{i,j}, j=i..i+1a)
    F_max  := max(F_{i,j}, j=i..i+1a)
    T_max  := min(E_{i−1}+X_i, F_size−F_{i−1}+Y_i, N)
    IF  −F_min > T_max THEN error("Algorithm failure") FI
    T_i    := max(−F_min, min(F_size−F_max, T_max), 0)
    E_i    := E_{i−1}−T_i+X_i
    F_i    := F_{i−1}+T_i−Y_i
OD
```

It might be thought that this algorithm requires a computation time that increases in proportion to la, on account of the computation of the maxima and minima over la samples in the expressions for $F_{min}$ and $F_{max}$. However, the person skilled in the art will be aware that it is possible to calculate running maxima and minima in a computation time proportional to log(la), so this need not be expensive even for long look-ahead periods.

Decoders with Finite Buffer Size

In describing the simple management strategy and the reduced latency algorithm we have made no mention of the decoder's buffer size, tacitly assuming that the decoder's buffer is large enough not to become over-filled. The simple algorithm is likely to be used in a real-time situation where the delay D is likely to be the important parameter, and we can ensure the buffer will not be over-filled if its size satisfies the inequality $F_{size} \geq N \times D$ In contrast, the reduced latency algorithm does not permit real-time encoding as it uses a backward pass. Hence the delay D plays a nominal role and is not a physically meaningful quantity. As D increases the encoder requires notionally more buffer memory, but the decoder does not. The buffer size $F_{size}$ must be at least the maximum value of $F_i$ encountered during the encoding, and if this is too large for the intended decoder, either N must be increased or the core encoder must be adjusted to produce a lower peak data rate, as will be discussed later.

The finite look-ahead algorithm takes account of a finite buffer-size in the decoder, nevertheless a sufficiently large decode buffer must be provided or the algorithm will fail. It is envisaged that the encoder will have ample memory so that a large value of D may be used and under-run or over-run of the encoder's buffer will not be a constraint.

Transmission of Delay Information

After the input is first applied, the decoder should in general not start to decode immediately, but should wait for its FIFO buffer to fill partially, so that there will be a reserve of data in case a passage of peak data rate follows almost immediately. In a simple system it is adequate for the decoder to use a fixed delay, but there are at least two circumstances in which it is better for the encoder to send delay information.

Firstly, the decoder may not see the start of the transmitted stream. For example, a radio link may be connected when the encoder has already been operating for some time; or in a CD or DVD situation the user may wish to start playing partway through a track. Referring to FIG. 2, the total delay through the buffers is D, but this is split in a time-varying way between the encode and decode buffers. Thus when the signal is first applied to the decoder, the decoder needs to know how much of the delay D should be applied in its own buffer in order to implement the model correctly. It is adequate in this case for the encoder to transmit periodically the delay $d_e$ through its FIFO buffer, so that the delay determination means 150 can determine the delay $d_d = D - d_e$ and initiate the flow of data from the FIFO buffer 60 to the core decoder 70 after that time.

Lacking such information, the decoder could be provided with a FIFO buffer of length 2×N×D bits, and the flow of data from the buffer 60 to the core decoder 70 would start after a fixed time D. This would guarantee that the decoder's buffer would not under-run or over-run, but requires twice as much memory as is strictly necessary.

(Alternatively a decoder with buffer of size N×D could be started after an arbitrary delay between 0 and D, and samples could be discarded or interpolated in the event of buffer under-run or over-run. Eventually, correct reproduction would be obtained, but as there would be incorrect reconstruction of the desired signal in the meantime, we do not look favourably on this solution.)

A second circumstance where transmission of delay information is important is with the two reduced latency algorithms described previously. Here the delay parameter D assumes less importance, and there is no obvious default value of the initial delay $d_d$ after which the core decoder should be started, even if the decoder sees the beginning of the encoded stream. Moreover, the solution of equipping the decoder with more memory than necessary and starting the decoder with a nominal delay will totally wipe out the advantage of reduced latency. (For example, in Table 3, if the encoder had started at block 11, it would have been correct for the decoder to start with a delay of zero, and any more than this would give rise to excess latency.)

Some encoders, such as those using the reduced latency encoding algorithms described above, maintain an explicit model of a decoder, and in this case the encoder can periodically transmit a "header" including a value such as $F_i$, indicating the state of the model decoder's FIFO buffer. When the data-stream is connected to a real decoder, the real decoder can wait for the header, then apply the stream to its FIFO buffer, then wait until the buffer has accumulated $F_i$ bits of data before feeding the data from the buffer to the core decoder.

The information relating to the state of the model decoder's buffer could alternatively be expressed in other ways, such as the time delay $d_d$ rather than the number of bits $F_i$.

Application to Lossless, Lossy and Video Compression

We have already mentioned the application of the invention to lossless compression of digital audio and further details are given in reference [2]. Table 2 is reproduced from this reference and shows that a reduction of 2 bits in the peak data rate is possible using the simple management strategy for a delay D of 116 mS. Using the reduced latency strategies it would be possible to reap this benefit on a medium such as DVD with a player latency that was completely unnoticeable for most of the time.

Most lossy audio compression systems are designed for a constant data rate on a frame-by frame basis. A constant bit-allocation per frame means that when the audio level increases, the quantisation step-size (and hence noise-level) must increase. A concern with such systems (see for example reference [4]) is that a transient towards the end of a frame will result in an increase in the noise-level for the whole frame, and in particular before the transient itself. This is very audible because of temporal unmasking.

Using the invention, the data rate from the core encoder could be allowed to increase for the frame containing the transient, provided it was reduced afterwards. This would ensure that the increase in noise-level occurred entirely after the transient, which is much less audible.

Another form of lossy compression, described in references [3] and [5], makes use of a pre-quantiser feeding a lossless encoder. The pre-quantiser discards information and thereby reduces the data rate from the lossless encoder. The choice of how much data to discard can be made adaptively, in an attempt to reduce the variations in the encoded data rate, or non-adaptively. In both cases there will remain variations in the rate from the encoder, and the use of a FIFO buffer according to the invention will allow a more advantageous trade-off between peak data rate and quality of encoding.

Video compression (of moving pictures) generally makes use of correlation between successive frames. At low bit-rates a near-stationary picture may be reproduced acceptably, and a moderate amount of movement may also be well reproduced if an advanced motion-following algorithm is used. The major challenge is at a scene-change, where the initial rendering may be very poor, but with detail and quality building up over the first few seconds.

It is clear that a temporary increase in data rate would allow a detailed picture to be built up much more rapidly. Using a FIFO buffer in the encoder and decoder according to the present invention, it would be possible to allow a large temporary increase in data rate to the decoder, while not significantly increasing the transmitted data rate. The decoder's FIFO buffer would empty rapidly during the initial period of the new scene, and would fill slowly during periods of little or no movement, pending the next scene-change.

A further application is to situations where more than one stream of data is to be recorded or transmitted for a given transmission medium, and within a constrained total data-rate. For example, a DVD may carry both variable-rate video information and variable-rate audio information, or it may carry more than one stream of audio information.

In this case, the first stream may be encoded either according to the invention or otherwise, and will use up a varying amount of the available total data value, resulting in a varying available rate for the second and any subsequent streams. The person skilled in the art will have no difficulty in adapting the buffer management algorithms previously described to this case; the major change to the equations herein is that "N" should be replaced by "$N_i$", the amount of data that it is possible to transmit in the ith time-slot. In addition, the definition of $F_{ij}$ in the description of the reduced-latency algorithm should be replaced by:

$F_{ij}$ is the prediction made at time-slot i of the contents of the decode buffer at time-slot j, assuming that $T_i = 0$; $T_k = N_k$ for $i < k \leq j$, given by $$F_{ij} = F_{i,j-1} - Y_i + \Sigma[N_k - Y_k, k=i+1 \ldots j]$$

Regulation of Encoding Parameters

Until now we have generally regarded the core encoder as a fixed algorithm producing a data-stream that we have no power to change. However, there are situations in which control may be exercised: we have encountered one in the above discussion of lossy compression where we have control over how much data to discard, and thereby the data rate from the core encoder. Another is that in lossless compression using IIR prediction filters [reference 2] the choice of prediction filter can be difficult, and the amount of compression achieved will depend on the computational effort applied to this task.

In general, we can consider the core encoder as parameterisable, and the encoder has the task of choosing the parameters to give the appropriate trade-off between the encoded data rate and other quantities such as computer time consumed and, in the case of lossy compression, the amount of data discarded.

Figure 3:
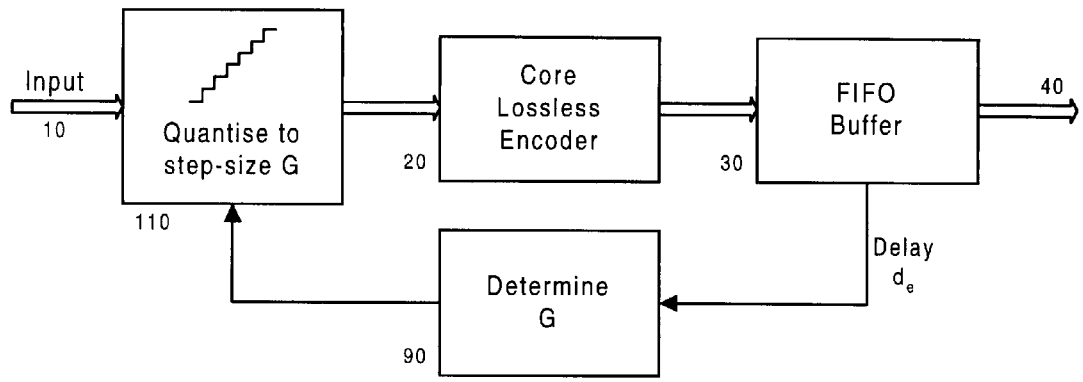
FIG. 3 shows an embodiment of the invention in which the input data are quantised before being applied to a core lossless encoder, the quantisation step-size being determined in dependence on the amount of data in a FIFO buffer.

An effective way to perform this task is to monitor the contents of the encoder's FIFO buffer. This is illustrated in FIG. 3, in the context of a lossy encoder that uses a pre-quantiser 110 having step-size G, followed by a core lossless encoder 20. It is assumed that the simple buffer management strategy described previously is used to control the transfer of data from the FIFO buffer 30 to the output 40. The varying delay $d_e$ in the encoder's buffer is monitored and applied to the step-size control means 90. As long as the buffer is empty, or nearly empty, the step-size G is given a low value, resulting in high-quality encoding. As the buffer fills, the step-size G is increased, thus reducing the data rate from the core encoder.

Similarly, with a core encoder whose computational effort is variable, minimal effort can be applied when the buffer is nearly empty, and progressively more effort as the buffer starts to fill. Suppose that there is a total FIFO buffering delay of D=40 ms, and that maximal effort is applied when the encoder's FIFO buffer holds 10 ms or more of data. Then the ability of buffers to absorb peaks of data rate will be no worse than with a delay D=30 ms and maximal effort applied all the time. Relative to a system with a 30 ms delay, we have used an extra 10 ms of delay in order to make the encoding process more economical during easy passages when the encoder's buffer remains nearly empty.

This strategy cannot be used directly when the data-transfer from the FIFO buffer to the output is controlled by one of the reduced latency algorithms described previously, as the amount of data in the encoder's buffer is kept high by the latency algorithm and can no longer be used as an indication of whether the data rate from the core encoder should be reduced. There is also a more fundamental point that if the amount of data in the buffer is controlled by an algorithm that uses look-ahead, feedback through the means 90 cannot be used as it would imply a circular dependency.

Figure 4:
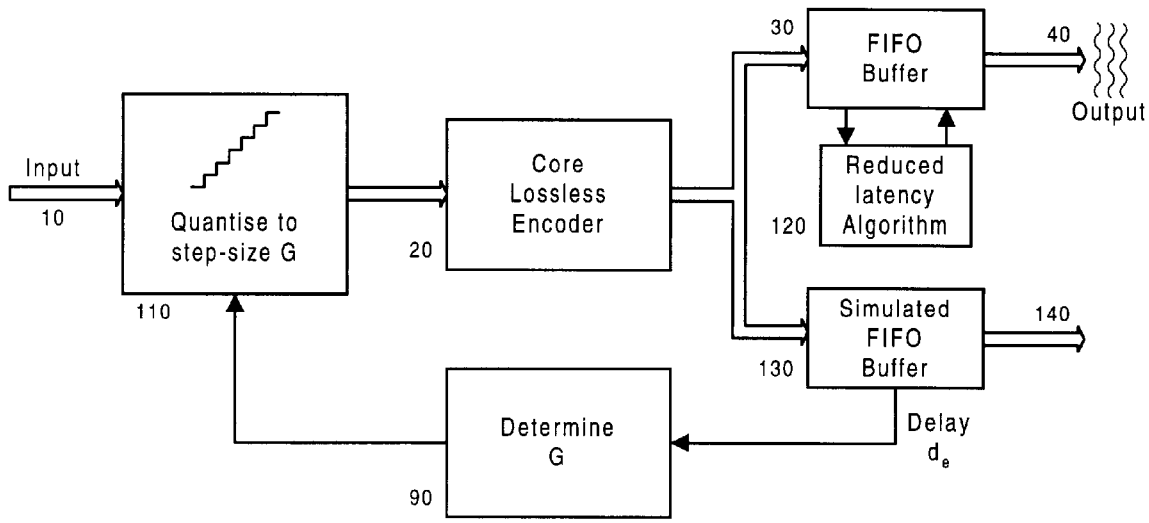
FIG. 4 shows an embodiment in which a quantisation step-size is determined in dependence on the amount of data in a simulated buffer, the emptying of which may be managed using a different algorithm from that used to empty the FIFO buffer which feeds the output of the complete encoder; and, FIG. 5 is a flow diagram showing the steps that might be executed in a software-based encoder according to the invention.

FIG. 4 shows an encoder that addresses this problem, wherein the output of the core encoder 20 is fed to the FIFO buffer 30, whose contents are transferred to the output 40 at a rate determined by the reduced latency algorithm 120. Simultaneously the output of the encoder 20 is fed to another FIFO buffer 130 whose contents are transferred to an output 140 using an algorithm, such as the simple management strategy described previously, that does not involve look-ahead. The delay $d_e$ in the buffer 130 is monitored and used by means 90 to control the encoding parameters in the same way as in FIG. 3. Using the simple management strategy, this delay $d_e$ depends entirely on previous outputs of the encoder 20, so the feedback loop through means 90 does not involve any circular dependency or non-causality. Suppose that the buffer 30 has the same size as the buffer 130, and that the maximum transfer rate of N bits per time-step applies to both buffers. In the previous discussion of table 3 we established that the reduced-latency algorithm is able to achieve successful transmission whenever the simple management strategy is able to do it. It follows that in FIG. 4, if the closed-loop control of the contents of buffer 130 via means 90 is successfully able to avoid over-run of buffer 130, then the buffer 30 will not over-run either. This establishes that the encoder of FIG. 4 is able to reap the advantages of the encoder of FIG. 3, but with reduced latency.

As the output 140 of buffer 130 is not used, it is clear that the buffer 130 may be replaced by a simulated buffer; all that is necessary is control logic that keeps account of the amount of data that would be in buffer 130 had it been provided.

In other embodiments of the invention, the means 90 in FIGS. 3 and 4 could determine general encoding parameters, for example parameters relating to computational effort, and in that case the output of means 90 would be applied to the core encoder 20 as well as, or instead of, to the pre-quantiser 110. It is also possible to monitor the amount of data $E_i$ in the buffer 30 or 130, or some other measure of its contents, instead of the delay $d_e$, and to use this as input to the control means 90.

File Based and Real-time Encoders

The model used in the discussions above has generally been of a signal-processing based encoder and decoder, in which a stream of samples is processed in real-time. In the context of audio compression this will often be the case for the decoding, but mastering of DVDs and CDs may well be performed on workstations where the input signal is presented as a file of data, and the encoding process is performed in non-real time. In that case the total delay D and the delay $d_e$ through the encoders FIFO buffer are conceptual delays, measured in simulated time rather than real time. The person skilled in the art will have no difficulty in transforming the concepts from the signal-processing based model to the file-based model.

It is in the context of file-based encoding that reducing computational effort in the easier passages, as discussed above, becomes useful, in order to reduce the total time to process a file.

It will be evident that the reduced-latency algorithm that involves a backward pass is appropriate for a file-based implementation, and cannot be done in a signal-processing implementation.

A real-time encoder will use the signal-processing model, and the delay D will be a physically meaningful quantity if there is a live link to a real-time decoder. It is possible to use the finite look-ahead algorithm in this case, however the look-ahead involves additional delay, and since the total delay is likely to be more important than the decoder latency in this case, the simple management strategy is likely to be preferred over the reduced-latency algorithms.

Pre-scan to Determine the Delay D or Other Parameters

In a real-time encoder, the delay D must be fixed at the start, but in the file based case the encoder can perform a pre-scan to determine the maximum required delay.

Figure 5:
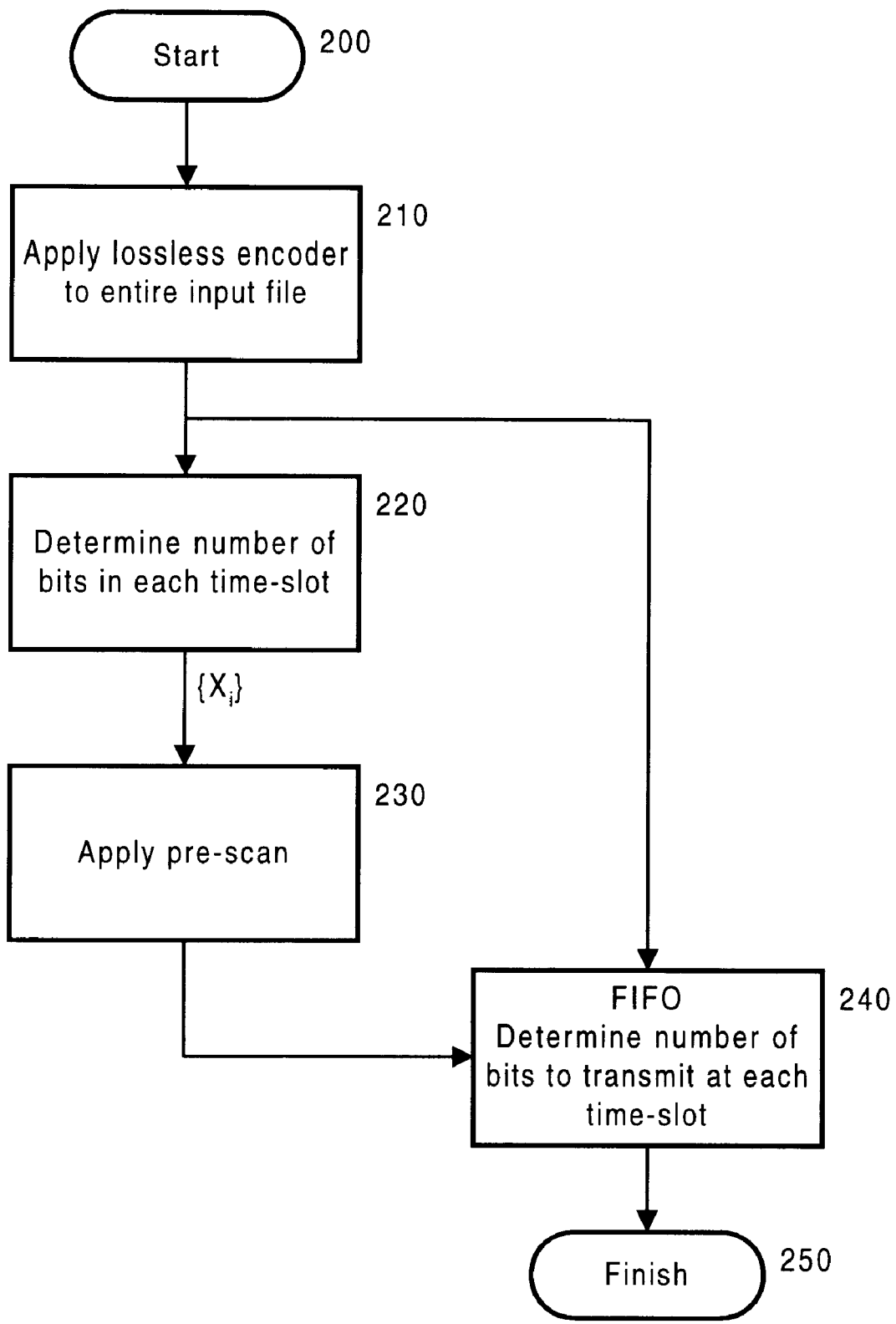

Referring to the flow diagram, FIG. 5, step 210 applies the core lossless encoder to the entire input file, and step 220 determines the number of bits $X_i$ produced at each time-step L Step 230 is the pre-scan which scans the data $\{X_i\}$ to determine the delay D or other parameter required for the buffering algorithm. Step 240 applies the FIFO buffer model to the data from step 210 to determine how much data should be transmitted in each time-slot, using control information derived from the pre-scan 230.

(Alternatively, if it is inconvenient to store the entire output of step 210, step 210 can be run a second time starting from the original data, but clearly this is inefficient of processor time.)

The pre-scan 230 may easily determine the necessary delay D by inspection, as in Table 1, or alternatively by modelling the simple buffer management strategy noting the maximum delay $d_e$ in the encoder's FIFO buffer, and making D greater than or equal to this value. This ensures that the decoder's delay $d_d$ is never negative, i.e. that the decoder's buffer will not under-run.

A different buffering algorithm may be applied in step 240 from the one modelled in step 230. For example step 230 may model the simple management strategy to determine D, then step 240 may use one of the reduced latency algorithms. This is valid because the reduced latency algorithms discussed previously are guaranteed to be successful using a given N and D if the simple management algorithm would have been successful using the same N and D.

It will be evident that the backward-pass reduced latency algorithm fits into the structure of FIG. 5, where the backward pass to determine $\{T_i\}$ would be incorporated into step 230, and the data $\{T_i\}$ would be passed as control information to the final encoding stage 240.

So far it has been assumed that N is given and D is the quantity to be determined. This is likely to the case if the peak data rate is limited by the physical medium. However if the desire is to produce a constant-rate stream of lowest possible rate, the pre-scan needs to determine N. This can be done by iterating the modelling in step 230 using various values of N to determine the lowest N that results in an acceptable value of D. (Or alternatively, that results in an acceptable latency, or that avoids under-run and over-run in the decoder's FIFO buffer.) This iteration consumes negligible computer time if performed by the bisection method, or one of the other efficient methods of univariate inverse interpolation.

Other Topologies and Variations

We have described some preferred embodiments of the invention, and the person skilled in the art will see various transformations the topologies described herein that are functionally equivalent and thus fall within the scope of the invention One variation is to note that storage and processing can be interchanged. Thus in FIGS. 1 and 2 the core decoder 70 may be placed before the FIFO buffer 60, or more generally if decoding process is separable into several cascaded stages, the processing may be distributed with some of it performed before the FIFO buffering and some of it performed afterwards. However in the context of data compression, the topology of FIG. 1 has the advantage of buffering the compressed data, which will require less memory than buffering decoded data.

Another variation is that a FIFO buffer need not necessarily appear as a physically separate component. In a software implementation, the effect of a FIFO can be achieved using an area of memory and a software module that maintains a "write pointer" and a "read pointer".

Moreover, the software implementing the invention could be distributed over different components of the total software. For example, in a DVD player controlled by an operating system and having software decoders for one or more compression systems, the operating system could maintain a FIFO buffer while a separate decoding module could implement the rest of a decoder according to the invention. A possible scheme is for the FIFO buffer to be filled with complete sectors of information from the disc, possibly by DMA hardware under interrupt control.

Many variations are possible on the strategies presented above for buffer management. For example, the amount of data transferred on each time-step could be proportional to the amount of data in the encoder's FIFO buffer, or it could be some other increasing function of the amount of data in the buffer. Other possibilities include aiming to keep the decoder's buffer partially full during 'normal' passages, reverting to the simple management strategy during passages of peak level. This provides reduced decoding latency without look-ahead in the encoder, albeit with some risk of data loss due to buffer over-run or under-run if a peak passage is encountered unexpectedly.

References

[1] P. G. Craven & M. A. Gerzon, 'Lossless Coding for Audio Discs', J. Audio Eng. Soc., vol. 44 no. 9 pp. 706–720 (September 1996)

[2] P. G. Craven, M. J. Law & J. R. Stuart, 'Lossless Compression using IIR Prediction Filters', J. Audio Eng. Soc. (Abstracts), vol. 45 no. 5 p. 404 (Mar. $22,^{nd}$ 1997)

[3] P. G. Craven & J. R. Stuart, 'Cascadable Lossy Data Compression Using a Lossless Kernel', J. Audio Eng. Soc. (Abstracts), vol. 45 no. 5 p. 404 (Mar. $22,^{nd}$ 1997)

[4] M. Bosi et. al., 'ISO/IEC MPEG-2 Advanced Audio Coding', J. Audio Eng. Soc. vol. 45 no. 10 pp. 789–814 (October 1997)

[5] 'Lossless Coding Method for Waveform Data', International patent application no. PCT/GB96/01164

We claim:

1. A method of encoding a stream of input data samples to produce a stream suitable for use with a transmission medium having a limitation of peak data rate, comprising the steps of: encoding the input data samples to produce a variable-rate stream of encoded data; feeding the variable-rate stream to a FIFO buffer; and, controlling the rate at which data are fed from the FIFO buffer to an output so that the rate at the output does not exceed a predetermined rate.

2. A method according to claim 1, further comprising the step of transmitting to the output information relating to the amount of data in the FIFO buffer.

3. A method according to claim 1, further comprising the step of transmitting to the output information indicating the amount of data in the FIFO buffer to enable a decoder to determine when to start decoding.

4. A method according to claim 1, in which the said step of encoding performs lossless compression.

5. A method according to claim 1, in which the said step of encoding performs lossy compression.

6. A method according to claim 1, in which the said step of encoding further comprises the steps of: quantising the said input data samples to produce a lower-resolution stream; and, losslessly compressing the said lower-resolution stream.

7. A method according to claim 1, in which the input data is a video signal.

8. A method according to claim 1, in which the input data is an audio signal.

9. A method according to claim 1, in which the said step of controlling is accomplished by transferring to the output at each of a predetermined time-step, an amount of data which is the smaller of the amount of data remaining in the FIFO buffer and the maximum amount allowed by the said predetermined rate.

10. A method according to claim 1, further comprising the step of maintaining a model of a corresponding decoder, the decoder comprising a FIFO buffer followed by a core decoder, wherein the encoder assumes an initial delay between the decoder receiving the encoded stream and passing it to the core decoder, the decoder's FIFO buffer filling partially during the delay, and in which the said step of controlling is performed so that the decoder's FIFO buffer should not under-run.

11. A method according to claim 10, in which the said FIFO buffer in the model decoder is assumed to have a finite capacity, and in which the said step of controlling is performed with regard also to the criterion that the model decoder's FIFO buffer should not over-run.

12. A method according to claim 10, further comprising the step of processing data relating to the data rate of the said variable-rate stream in order to determine a value for the said initial delay such that the said decoder's FIFO buffer will not under-run.

13. A method according to claim 10, further comprising the steps of: deriving from the said model a varying delay between the decoder's reception of a part of the transmitted stream and its decoding by the core decoder; and, periodically transmitting information relating to the said varying delay, thereby enabling a decoder which is presented with a part of the encoded data-stream not including its beginning to determine an appropriate delay after which to start decoding.

14. A method according to claim 10, further comprising the step of adjusting the amount of data transmitted in each of a predetermined time-step to minimise the amount of data in the FIFO buffer of the said model decoder, and thereby minimise the decode latency of the encoded stream.

15. A method according to claim 14, in which the said step of adjusting is performed by processing in reverse order data relating to the data rate of the said variable-rate stream.

16. A method according to claim 14, in which the said step of adjusting uses a finite look-ahead over data relating to the data rate of the said variable-rate stream.

17. A method according to claim 1, further comprising the step of performing a pre-scan of the entire stream of data to be transmitted to determine a value for the said predetermined rate.

18. A method according to claim 1, in which the said encoded stream of data is transmitted together with another stream of data, further comprising the step of processing data relating to the data rate of other stream of data at a number of instants to determine an appropriate value for the said predetermined rate at each instant.

19. A method according to claim 1, in which the said step of encoding is parameterisable in a manner that affects the data rate of the said variable-rate stream, further including the step of adjusting the parameters in response to the amount of data in a buffer which receives the said variable-rate stream.

20. A method according to claim 19, in which the buffer is the FIFO buffer.

21. A method according to claim 19, in which the buffer is a simulated buffer which empties at a rate responsive to the amount of data it contains.

22. A method according to claim 19, in which the step of encoding is lossy and discards an amount of data which increases as the said buffer fills.

23. A method according to claim 22, in which the said step of encoding further comprises the steps of: quantising the said input data samples to produce a lower-resolution stream; and, losslessly compressing the said lower-resolution stream, wherein a step size used in the quantising increases as the said buffer fills.

24. A method according to claim 19, in which the said step of adjusting the parameters includes adjusting the computational effort applied in the said step of encoding.

25. A recording medium (including, without limitation, CD or DVD) containing an encoded data stream produced using the method of claim 1.

26. A recording medium according to claim 25, in which the encoded data stream includes information to allow an appropriate decoder, comprising an input which feeds a FIFO buffer, and a core decoder which reads data from the FIFO buffer at a variable rate which sometimes exceeds the maximum rate of the input stream, and delivers decoded data to an output, arranged so that after the serial stream is applied to the input there is a delay before the core decoder entracts the data from the FIFO buffer and decodes it, to determine said delay.

27. A data-compression system for producing a variable-rate compressed stream with a limited peak rate, comprising an encoder having a core encoder followed by a FIFO buffer, and a decoder having a FIFO buffer followed by a core decoder, such that during passages of peak data rate, the decoder's FIFO buffer delivers data to the core decoder at a faster rate than the said limited peak rate.

28. A data-compression system according to claim 27, wherein the encoder is configured to transmit information which allows the decoder to establish an appropriate delay through the decoder's FIFO buffer.

29. A decoder for a serial stream of compressed data, comprising an input which feeds a FIFO buffer, and a core decoder which is configured to read data from the FIFO buffer at a variable rate which sometimes exceeds the maximum rate of the input stream, and delivers decoded data to an output, arranged so that after the serial stream is applied to the input, there is a delay before the core encoder entracts the data from the FIFO buffer and decodes it.

30. A decoder according to claim 29, in which the said delay is determined by the decoder.

31. A decoder according to claim 29, in which the decoder is configured to read information from the input stream in order to determine the said delay.

32. An encoder for a serial stream of data, comprising a core encoder which delivers a variable-rate stream of compressed data, a FIFO buffer which receives data from the core encoder, and an output, the encoder being configured so that the rate at which data is transferred from the buffer to the output does not exceed a predetermined rate.

33. An encoder according to claim 32, which is configured to transmit information relating to the amount of data in the FIFO buffer.

34. An encoder according to claim 32, which is configured to transmit information indicating the amount of data in the FIFO buffer to enable a decoder to determine when to start decoding.

35. An encoder according to claim 32, in which the core encoder is adapted to perform lossless compression.

36. An encoder according to claim 32, in which the core encoder is adapted to perform lossy compression.

37. An encoder according to claim 36, in which the core encoder is configured for audio signals and comprises a prequantiser followed by a lossless encoder.

38. An encoder according to claim 32, in which the core encoder is adapted to perform compression of video signals.

39. An encoder according to claim 32, which is adapted to transfer at each of a predetermined time step to the output an amount of data which is the smaller of that remaining in the FIFO buffer and the maximum amount allowed by the said predetermined rate.

40. An encoder according to claim 32, comprising means for maintaining a model of a corresponding decoder, the decoder comprising a FIFO buffer followed by a core decoder, wherein the encoder assumes an initial delay between the decoder receiving the encoded stream and passing it to the core decoder, the decoder's FIFO buffer filling partially during the delay, and on this assumption the encoder is operative to control the amount of data transmitted on each time step so that the decoder's FIFO buffer does not under-run.

41. An encoder according to claim 40, in which the model assumes a finite capacity for the decoder's FIFO buffer, and the encoder is operative to ensure that the decoder's buffer does not over-run.

42. An encoder according to claim 40, in which the core encoder is configured to perform a pre-scan of the entire stream of data to be transmitted to determine a value for the said initial delay such that the said decoder's FIFO buffer will not under-run.

43. An encoder according to claim 40, which is configured to derive from the said model a varying delay between the decoder's reception of a part of the transmitted stream and its decoding by the core decoder, and transmit information related to the said varying delay, thereby enabling a decoder which is presented with a part of the encoded data-stream not including its beginning to start decoding the said part after an appropriate delay.

44. An encoder according to claim 32, which is configured to collect data relating to the data rate produced by the core encoder for the entire stream of data to be transmitted, and determine an appropriate value for the said predetermined data rate.

45. An encoder according to claim 40, which is configured to further adjust the amount of data transmitted in each time-step with the object of minimising the amount of data in the FIFO buffer of the said model decoder, and thereby minimise the decode latency of the encoded stream.

46. An encoder according to claim 45, which is adapted to perform said further adjustment using a backward pass over the data stream.

47. An encoder according to claim 45, which is adapted to perform said further adjustment using a look-ahead over a finite time-window on the transmitted stream.

48. An encoder according to claim 32, in which the said core encoder is parameterisable in a manner that affects the encoded data rate, and the parameters are adjustable in response to the amount of data in a buffer connected to the output of the core encoder.

49. An encoder according to claim 48, in which said buffer is the FIFO buffer.

50. An encoder according to claim 48, in which said buffer is a simulated buffer which is filled from the core encoder and emptied at a rate responsive to the amount of data it contains.

51. An encoder according to claim 49, in which the core encoder is lossy, and the amount of data discarded increases as the said buffer fills.

52. An encoder according to claim 51, in which the core encoder is a lossy encoder adapated for audio signals, comprising a prequantiser followed by a lossless encoder, wherein the said discarding of data is accomplished by increasing the step size of the prequantiser.

53. An encoder according to claim 48, in which the at least one of the said parameters controls the computational effort applied in the core encoder.

54. An encoder according to claim 32, adapted to operate in accordance with the method of claim 1.

* * * * *